(12) United States Patent
Yen et al.

(10) Patent No.: US 9,866,241 B2
(45) Date of Patent: Jan. 9, 2018

(54) TECHNIQUES FOR ADAPTIVE LDPC DECODING

(71) Applicant: SK Hynix Inc., Gyeonggi-do (KR)

(72) Inventors: Johnson Yen, Fremont, CA (US); Abhiram Prabhakar, Fremont, CA (US); Chung-Li Wang, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/073,034

(22) Filed: Mar. 17, 2016

(65) Prior Publication Data

US 2017/0093428 A1   Mar. 30, 2017

Related U.S. Application Data

(60) Provisional application No. 62/232,560, filed on Sep. 25, 2015.

(51) Int. Cl.
*H03M 13/11* (2006.01)
*H03M 13/45* (2006.01)

(52) U.S. Cl.
CPC .... *H03M 13/1128* (2013.01); *H03M 13/1111* (2013.01); *H03M 13/1177* (2013.01); *H03M 13/45* (2013.01)

(58) Field of Classification Search
CPC ......... H03M 13/1128; H03M 13/1102; H03M 13/1105; H03M 13/1177; G06F 11/1012
See application file for complete search history.

(56) References Cited

U.S. PATENT DOCUMENTS

2015/0149855 A1*  5/2015  Alhussien ........... G06F 11/1012
                                                               714/758

OTHER PUBLICATIONS

Emarn et al., simplified variable scaled Min-Sum LDPC decoder for irregular LDPC codes, 2015, E-just University, pp. 1 to 6 (retrived from google.com).*
Huang et al., A channel adaptive non-binary LDPC decoder, Oct. 2015, IEEE, pp. 1-6.*

* cited by examiner

*Primary Examiner* — Shelly A Chase
(74) *Attorney, Agent, or Firm* — Kilpatrick Townsend & Stockton LLP

(57) ABSTRACT

Techniques are described for an adaptive low density parity check (LDPC) decoder. The techniques include receiving a first set of values corresponding to a first low density parity check codeword and noise, performing a first plurality of iterations of an iterative decoding algorithm using a first set of decoding parameters to decode the received first set of values, comparing a metric with a first threshold, and upon determining that the metric is larger than the threshold: selecting a second set of decoding parameters for the iterative LDPC decoder and performing a second plurality of iterations of the iterative LDPC decoding algorithm using the second set of decoding parameters to decode the received first set of values and generate a first set of decoded bits.

20 Claims, 7 Drawing Sheets

| SF1 | SF2 | SF3 | Initial LLR |
|-----|-----|-----|-------------|
| 0.5 | 0.6 | 0.8 | 3 |
| 0.6 | 0.7 | 0.9 | 2 |
| 0.4 | 0.5 | 0.7 | 1 |

FIG. 5

TECHNIQUES FOR ADAPTIVE LDPC DECODING

CROSS-REFERENCE TO RELATED APPLICATIONS

The present application claims priority to Provisional Application No. 62/232,560, entitled "Adaptive LDPC Decoding," filed Sep. 25, 2015, which is assigned to the assignee hereof and expressly incorporated by reference herein in its entirety.

TECHNICAL FIELD

The present disclosure relates generally to error correcting codes, and in particular, to an adaptive decoding technique for decoding low density parity check codes.

BACKGROUND

Error correction codes (ECC) are used to detect and/or correct errors in received data in order to increase performance and efficiency of systems. Low-density parity check codes (LDPCs) are a class of ECC codes that have very good performance. LDPC codes are used in storage systems, communication systems, and the like to reduce power consumption while allowing higher throughput, and/or increased reliability.

SUMMARY

In one example, an adaptive low density parity check (LDPC) decoding technique is described. The adaptive decoding includes, in part, receiving a first set of values corresponding to a first low density parity check codeword and noise, performing a first plurality of iterations of an iterative decoding algorithm using a first set of decoding parameters to decode the received first set of values, and comparing a metric with a first threshold. In one example, the metric is a checksum value corresponding to number of parity check failures in a decoded codeword after the first plurality of iterations.

Upon determining that the metric is larger than the threshold, a second set of decoding parameters is selected for the iterative LDPC decoder and a second plurality of iterations of the iterative LDPC decoding algorithm are performed using the second set of decoding parameters to decode the received first set of values and generate a first set of decoded bits. In one example, the second set of decoding parameters includes one or more scaling factors and one or more initial log likelihood ratio (LLR) values.

In one example, at least one of the scaling factors in the second set of decoding parameters is different from a corresponding scaling factor in the first set of decoding parameters. In one example, at least one of the initial log likelihood ratio (LLR) values is in the second set of decoding parameters is different from a corresponding LLR value in the first set of decoding parameters. In one example, the first set of decoding parameters and the second set of decoding parameters are stored in a table comprising a plurality of sets of decoding parameters.

In one example, the method further includes, in part, calculating a checksum value after each of the first plurality of iterations to generate a plurality of checksum values, checking if almost all of the plurality of checksum values remain between the first threshold and a second threshold, if yes, performing the second plurality of iterations of the iterative LDPC decoding algorithm using the second set of decoding parameters to decode the received first set of values and generate a first set of decoded bits.

In one example, the LDPC decoding algorithm is a hard decoding message passing algorithm. In one example, the LDPC code is irregular having at least a first column weight and a second column weight, wherein a first scaling factor corresponds to one or more columns having the first column weight and the second scaling factor corresponds to one or more columns having the second column weight.

In one example, an apparatus for adaptive decoding is disclosed. The apparatus includes, in part, at least one processor and a memory coupled to the at least one processor. The at least one processor is configured to receive a first set of values corresponding to a first LDPC codeword and noise, perform a first plurality of iterations of an iterative decoding algorithm using a first set of decoding parameters to decode the received first set of values, compare a metric with a first threshold, and upon determining that the metric is larger than the first threshold, select a second set of decoding parameters for the iterative LDPC decoder, perform a second plurality of iterations of the iterative LDPC decoding algorithm using the second set of decoding parameters to decode the received first set of values and generate a first set of decoded bits.

In one example, a non-transitory processor-readable medium for adaptive decoding is disclosed. The non-transitory processor readable medium includes processor-readable instructions configured to cause one or more processors to receive a first set of values corresponding to a first LDPC codeword and noise, perform a first plurality of iterations of an iterative decoding algorithm using a first set of decoding parameters to decode the received first set of values, compare a metric with a first threshold. Upon determining that the metric is larger than the first threshold select a second set of decoding parameters for the iterative LDPC decoder, and perform a second plurality of iterations of the iterative LDPC decoding algorithm using the second set of decoding parameters to decode the received first set of values and generate a first set of decoded bits.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 5 illustrates an example table corresponding to one or more decoding parameters, in accordance with certain embodiments of the present disclosure.

DETAILED DESCRIPTION

Low density parity check (LDPC) codes are linear block codes defined by a sparse parity check matrix H, which consists of zeros and ones. The term "sparse matrix" is used herein to refer to a matrix in which number of non-zero values in each column and each row is much less than its dimension. The term "column weight" is used herein to refer to number of non-zero values in a specific column of the matrix. The term "row weight" is used herein to refer to number of non-zero values in a specific row of the matrix. In general, if column weights of all of the columns in a parity check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

Certain embodiments provide a novel adaptive decoding algorithm for irregular LDPC codes that mitigates the error floor, improves error correction capability and improves performance of irregular LDPC codes compared to other known decoding algorithms for LDPC codes. In general, an LDPC decoder tends to have a high chance for error floor.

Figure 1:
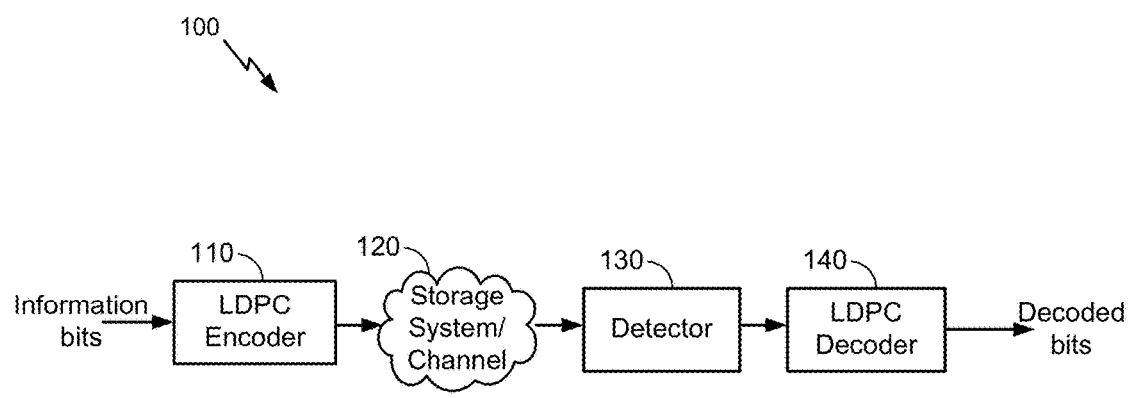
FIG. 1 illustrates an example high level block diagram of an error correcting system, in accordance with certain embodiments of the present disclosure.

FIG. 1 illustrates an example high level block diagram of an error correcting system, in accordance with certain embodiments of the present disclosure. In the example shown, LDPC encoder 110 receives information bits that include data which is desired to be stored in a storage system 120. LDPC encoded data is output by LDPC encoder 110 and is written to storage 120. In various embodiments, storage 120 may include a variety of storage types or media such as (e.g., magnetic) disk drive storage, Flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives data from the storage system. The received data may include some noise or errors. Detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by LDPC decoder are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the code word and the other set of nodes, e.g., check nodes, correspond to the set of parity check constraints satisfied by the code words. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In Quasi-cyclic ("QC") LDPC codes, the parity check matrix H is structured into blocks of p×p matrices such that a bit in a block participates in only one check equation in the block, and each check equation in the block involves only one bit from the block. In QC-LDPC codes, a cyclic shift of a code word by p results in another code word. Here p is the size of square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p.

From an LDPC parity check matrix, a LDPC generator matrix can be generated. A generator matrix is used to generate LDPC encoded data from the input data. For example, if the input data is represented as u, a 1×(n−m) matrix, and the encoded write data is represented as c (a 1×n matrix) then c=u*G, where "*" is a matrix multiplication. In some cases, a generator matrix (G) is manipulated to be in a special form (i.e., a systematic matrix) where G=[I P] and I is the identity matrix and P is a parity generator matrix. In systematic form, the encoded data (c) includes the input data (u) in its original form. In one example, the encoded data may be the input data (u) followed by the parity bits. Parity data (p) may be obtained from u*P and when combined (e.g., by appending or concatenating) with the input data generates the codeword (i.e., the encoded data).

Figures 2A, 2B:
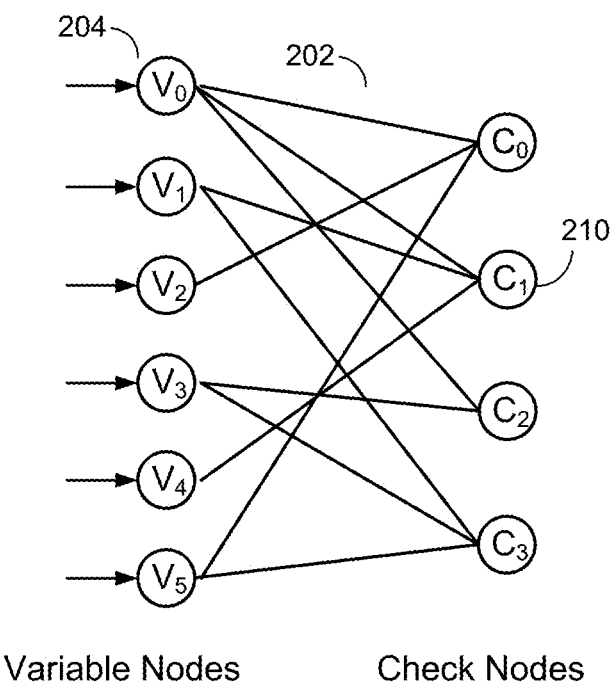
FIG. 2A-2B illustrate an example parity check matrix and an example graph representing the parity check matrix, in accordance with certain embodiments of the present disclosure.

FIG. 2A illustrates an example parity check matrix and FIG. 2B illustrates an example bipartite graph corresponding to the parity check matrix shown in FIG. 2A. In this example, the parity check matrix has 6 column vectors and 4 row vectors. Network 202 shows the network corresponding to parity check matrix 200. The variable nodes in network 202 correspond to the column vectors in matrix 200 and the check nodes in network 202 correspond to the row vectors of matrix 200. The interconnections between the nodes are determined by the values of matrix 200, where a 1 indicates the corresponding check node and variable nodes have a connection and a 0 indicates there is no connection. For example, the 1 in the leftmost column vector and the second row vector from the top in matrix 200 corresponds to the connection between variable node 204 and check node 210.

A message passing algorithm is generally used to decode LDPC codes. Several variations of the message passing algorithm exist in the art, such as min-sum algorithm, scaled min-sum algorithm or the like. In general, any of the variations of the message passing algorithm may be used in the proposed adaptive LDPC decoder without departing from the teachings of the present disclosure. Message passing uses a network of variable nodes and check nodes, as shown in FIG. 2B. The connections between variable nodes and check nodes are described by and correspond to the values of the corresponding parity check matrix, as shown in FIG. 2A.

A hard decision message passing algorithm may be performed as follows: In a first step, each the variable nodes send a message to one or more check nodes that are connected to them. In this case, the message is a value that each of the variable nodes believes to be their correct value.

In the second step, each of the check nodes calculates a response to send to the variable nodes that are connected to them using the information that they previously received from the variable nodes. The response message corresponds to a value that the check node believes that the variable node should have based on the information received from the other variable nodes connected to that check node. This response is calculated using the parity check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed as follows: in this example, $L(q_{ij})$ represents a message that is sent by variable node $v_i$ to check node $c_j$; $L(r_{ji})$ represents is the message sent by check node $c_j$ to variable node $v_i$; and $(L(c_i)$ represents initial LLR value for each variable node $v_i$. Variable node processing for each $L(q_{ij})$ can be done through the following steps:
(1) Read $L(c_i)$ and $L(r_{ji})$ from memory.
(2) Calculate $L(Qi\text{-sum})=L(c_i)+\text{Scaling Factor}*\Sigma_{j'\in c_i}L(r_{ij})$.
(3) Calculate each $L(Qi\text{-sum})-L(r_{ij})$.
(4) Output $L(Qi\text{-sum})$ and write back to memory.

(5) If this is not the last column of the memory, go to Step 1 and increment i by one.
(6) Compute parity check-sums, if they are all equal to zero or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj\text{-sum}) = \left(\prod_{i'\in R_j} \alpha_{i'j}\right)\emptyset\left(\sum_{i'\in R_j} \emptyset(\beta_{i'j})\right)$$

$$\alpha_{ij} = \text{sign}(L(q_{ij})), \beta_{ij} = |L(q_{ij})|,$$

$$\emptyset(x) = -\log\left(\tanh\left(\frac{x}{2}\right)\right) = \log\left(\frac{e^x+1}{e^x-1}\right)$$

(3) Calculate the individual $L(r_{ji})=(\Pi_{i'\in R_{ji}}\alpha_{ij})\emptyset(\Sigma_{i'\in R_{ji}}\emptyset(\beta_{i'j}))$ for check nodes.
(4) Write back $L(r_{ji})$ to memory.
(5) If this is not the last row of memory, then go to the first step and increment j by one.

Figure 3:
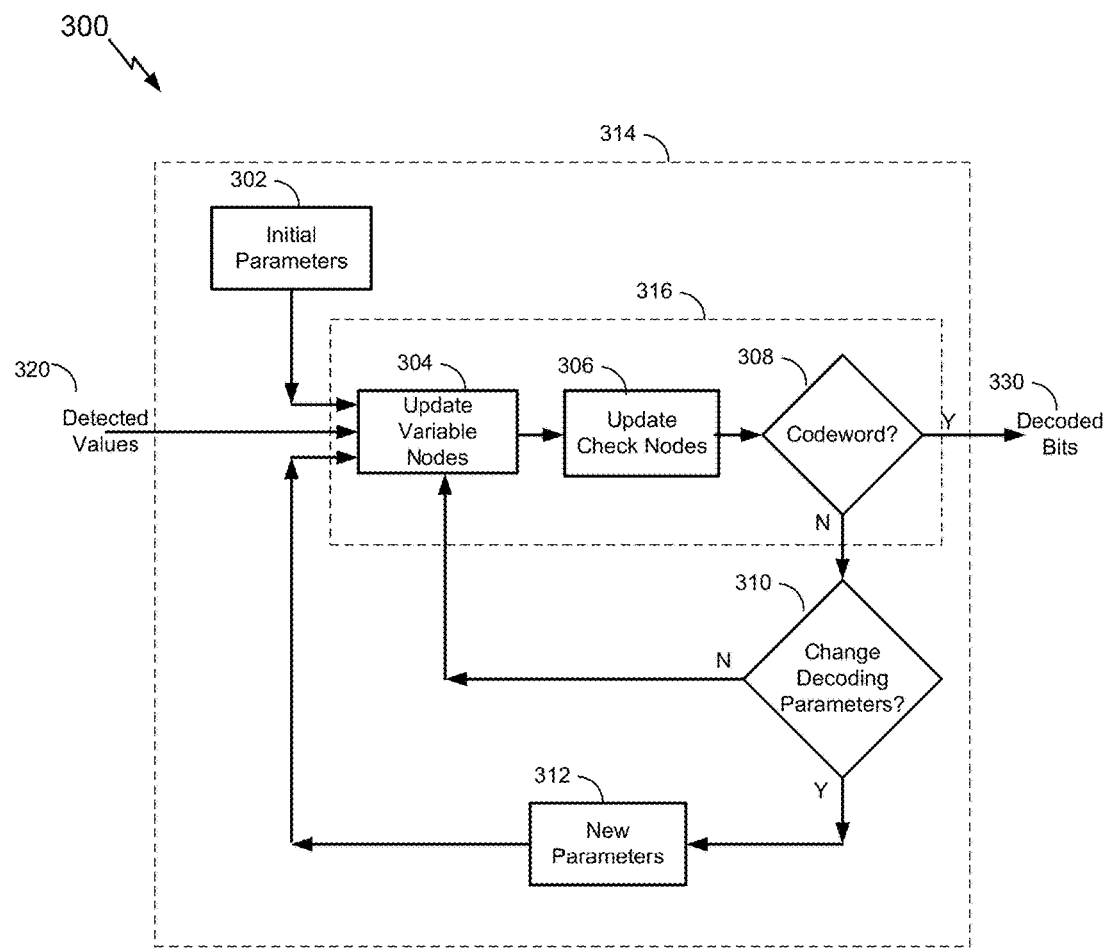
FIG. 3 illustrates a high level flowchart of the adaptive decoding algorithm, in accordance with certain embodiments of the present disclosure.

FIG. 3 illustrates a high level flowchart of the adaptive decoding as described herein, in accordance with certain embodiments of the present disclosure. As illustrated, the detected values 320 enter the adaptive LDPC decoder 314. At the beginning of the message passing decoding algorithm, initial parameters 302 are used to decode the detected values by updating the variable node messages 304 and updating the check node messages 306. LDPC decoder 316 in each iteration, updates the variable node messages 302, updates the check node messages 306, and checks whether or not a valid codeword is found. At block 308, it is checked to see the resulting values conform to a valid LDPC codeword or not. If a valid codeword is found, decoding is considered to be successful and the decoded bits 330 are sent out from the adaptive decoder 314. However, if a valid codeword is not found, the decoder decides whether or not to change the decoding parameters (e.g., initial LLR values, scaling factor values, and any other parameters used in the decoder). If the decoder decides that it is not time for adjusting or changing the parameters yet, the decoder continues to perform another iteration of the message passing algorithm on the partially decoded codeword. If the adaptive decoder decides that the progress in decoding is slow by checking one or more metrics, the decoder adjusts the decoding parameters by selecting a new set of parameters for the LDPC decoder 316 and reset the decoding process from the beginning with the new set of decoding parameters 312.

In general, the adaptive decoder could monitor any metric to decide whether or not to adjust the decoding parameters. In one embodiment, the adaptive decoder monitors checksum value to decide when to change the values of scaling factors and initial log likelihood ratio (LLR) values. The term checksum is used herein to refer to number of parity check failures in a codeword after each iteration of the decoding algorithm.

In general, irregular LDPC decoders may be sensitive to scaling factor values and initial LLR values. In many cases, failed codewords can be successfully decoded with different set of scaling factors and initial LLR values. Therefore, in one embodiment, the adaptive decoder stores multiple set of LLR and scaling factors, which can be used during the decoding process to result in a better error correction performance.

In one embodiment, one or more scaling factors and/or initial LLR values may be changed in the decoder if one or more of the following cases occur. For example, if the checksum value is large (e.g., more than a threshold) after certain number of iterations has passed from the beginning of the decoding algorithm. It should be noted that a large checksum value indicates a large number of bit errors in the codeword. In one example, the checksum value may be compared with a threshold after 10 decoding iterations to decide whether or not to adjust/change the decoding parameters.

In one embodiment, the check-sum value may be recorded and compared over a few iterations. The checksum value may be compared with two thresholds to see whether or not the value is oscillating between the two thresholds without much improvement in decoding. In some cases, the checksum value may remain a small value after several iterations are passed without much progress (e.g., reduction). For example, the checksum value may remain constant between $5^{th}$ and $10^{th}$ iterations, which indicates that the decoding parameters are not suitable for decoding the codeword and it is better to change those parameters in the adaptive decoder. In this case, a new set of decoding parameters may help the adaptive decoder to reach a correct codeword.

For certain embodiments, the check-sum value may be monitored to see if it is reduced more than a predefined threshold over a number of iterations. For example, if the checksum is decreased less than 20 percent in five iterations, then the decoding may be restarted with a new set of decoding parameters. It should be noted that the percentage of decrease and the number of iterations can generally have any values without departing from the teachings of the present disclosure. These values may be determined by simulation in different scenarios.

In one embodiment, the adaptive decoder uses the checksum value or any other metric in early iterations to determine whether or not the appropriate scaling factors and initial LLR values are being used in the decoder. If the adaptive decoder determines that these decoding parameters are not suitable for decoding the received codeword, the decoder selects a new set of decoding parameters and restarts the decoding process. In one example, if a decoder usually performs 80 iterations to decode an LDPC codeword, the adaptive decoder may check progress of the decoding after 5 or 10 iterations to see if the decoding parameters are suitable for decoding the codeword or if they need to be adjusted. In this case, after 10 iterations, the adaptive decoder may decide to change the decoding parameters to a new set of values without wasting any more time (until it reaches a maximum number of iterations (e.g., 80) and realizing that a correct codeword is not found.

In one embodiment, the adaptive decoder can change the values (scaling factors and initial LLR values) in a relatively fast pace, such as every 5~10 iteration. In this case, different sets of values can be run inside the decoder to improve the decoding success rate and mitigate the error floor.

Figure 4:
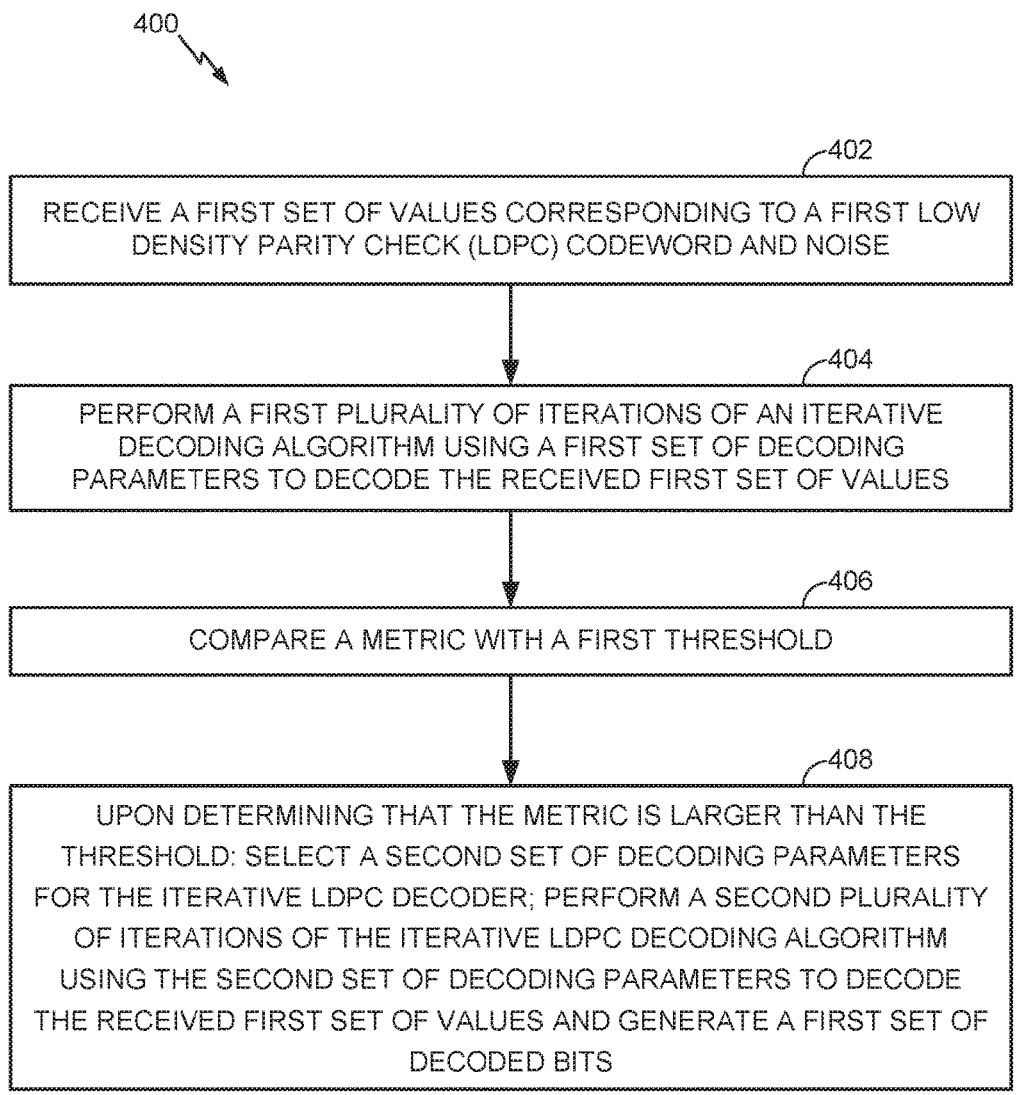
FIG. 4 illustrates example operations that may be performed by a device to adaptively decode an LDPC codeword, in accordance with certain embodiments of the present disclosure.

FIG. 4 illustrates example operations that may be performed by a device to adaptively decode an LDPC codeword, in accordance with certain embodiments of the present disclosure. At 402, a first set of values corresponding to a first low density parity check (LDPC) codeword and noise is received. In one embodiment, the LDPC code is irregular having at least a first column weight and a second column weight, wherein a first scaling factor corresponds to one or more columns having the first column weight and the second scaling factor corresponds to one or more columns having the second column weight.

At 404, a first plurality of iterations of an iterative decoding algorithm is performed using a first set of decoding parameters to decode the received first set of values. In one embodiment, the LDPC decoding algorithm can be a soft decision and/or a hard decision message passing algorithm.

At 406, a metric is compared with a first threshold. In one embodiment, the metric is a checksum value corresponding to number of parity check failures in a decoded codeword after the first plurality of iterations. In general, the metric may be calculated based on any of the internal parameters of the decoder without departing from the teachings of the present disclosure.

At 408, upon determining that the metric is larger than the threshold, a second set of decoding parameters is selected for the iterative LDPC decoder. In addition, a second plurality of iterations of the iterative LDPC decoding algorithm is performed using the second set of decoding parameters to decode the received first set of values and generate a first set of decoded bits.

In one embodiment, the second set of decoding parameters comprises one or more scaling factors and one or more initial log likelihood ratio (LLR) values. In one embodiment, the first set of decoding parameters and the second set of decoding parameters are stored in a table comprising a plurality of sets of decoding parameters.

In one embodiment, at least one of the scaling factors in the second set of decoding parameters is different from a corresponding scaling factor in the first set of decoding parameters. In one embodiment, at least one of the initial log likelihood ratio (LLR) values is in the second set of decoding parameters is different from a corresponding LLR value in the first set of decoding parameters.

In one embodiment, a checksum value is calculated after each of the first plurality of iterations to generate a plurality of checksum values. The decoder then checks if almost all of the plurality of checksum values remain between the first threshold and a second threshold. If yes, the decoder performs the second plurality of iterations of the iterative LDPC decoding algorithm using the second set of decoding parameters to decode the received values and generate a first set of decoded bits.

FIG. 5 illustrates an example table corresponding to one or more decoding parameters, in accordance with certain embodiments of the present disclosure. As illustrated, several scaling factors SF0, SF1, SF2, . . . may be stored in a table. In one example, in an irregular LDPC code with three different column weights r0, r1 and r2, three sets of scaling factors SF0, SF1, SF2 may be defined, each corresponding to one of the column weights. In one example, the adaptive decoder may start decoding a received codeword using the first set of scaling factors (e.g., SF1). In this example, the decoder may use a scaling factor of 0.5 for the check nodes corresponding to the column weight r1, a scaling factor of 0.6 for the check nodes corresponding to the column weight r2, and a scaling factor of 0.4 for the check nodes corresponding to the column weight r3 in the parity check matrix. If the progress in the decoding is not desirable after, for example, 10 iterations, the decoder may select a second set of the scaling factors (e.g., SF2) and restart the decoding process with the new set of decoding parameters (e.g., SF2). Similarly, the adaptive decoder may select a different initial LLR value for the variable nodes if the decoding is not progressing well. For example, in hard decision decoding with 3 bit initial LLR values, the adaptive decoder may change the initial LLR value from 2 to 1 and restart the decoding process.

In one embodiment, the sets of decoding parameters can be generated by simulating the parameters of the system under consideration. In addition, the parameters may be characterized with real NAND devices. In one embodiment, the decoding parameters, such as scaling factors and/or initial LLR values may be programmable and can be written into a SRAM in Decoder for different target NAND devices.

Figure 6:
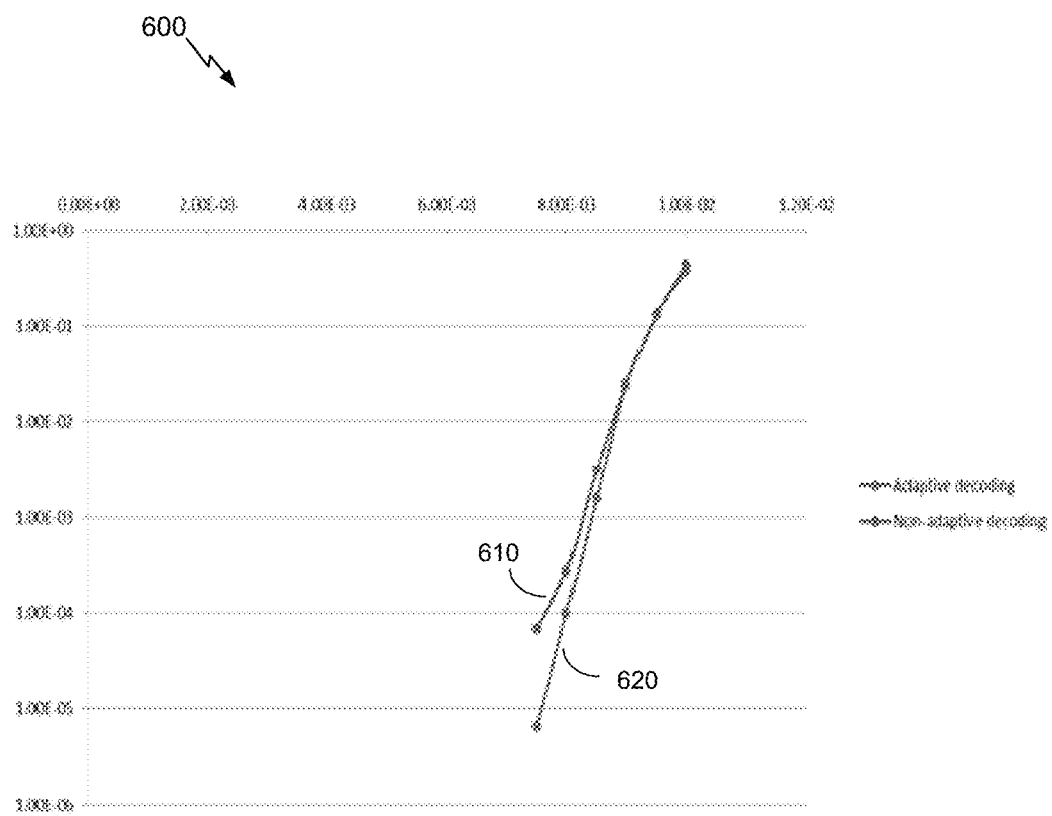
FIG. 6 illustrates error correction capability of the proposed adaptive decoding compared to error correction capability of a regular, non-adaptive decoder, in accordance with certain embodiments of the present disclosure.

FIG. 6 illustrates error correction capability of the proposed adaptive decoding compared to error correction capability of a regular, non-adaptive decoder. Curve 610 shows the error correction performance of a non-adaptive decoder and curve 620 shows error correction performance of the proposed adaptive decoder. As can be seen, the adaptive decoder as described herein, shows better performance than the non-adaptive decoder. In addition, the adaptive decoder 620 does not show an error floor. In contrast, the non-adaptive decoder 610 shows an error floor around CWFR=1E-4.

Figure 7:
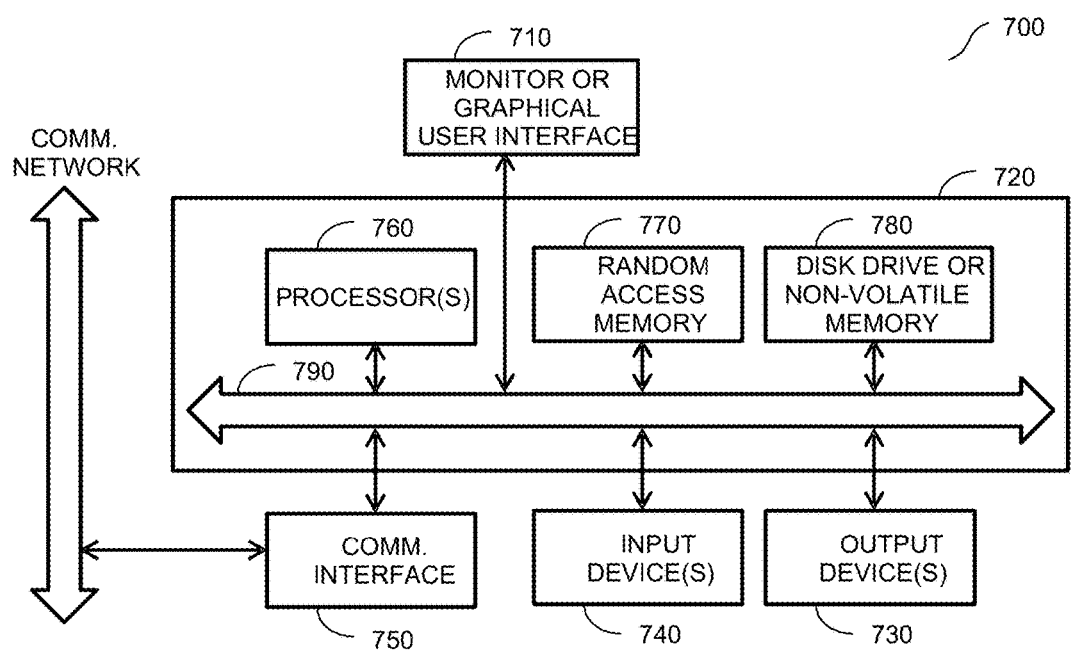
FIG. 7 describes one potential implementation of a device which may be used to decode an LDPC codeword, according to one embodiment.

FIG. 7 describes one potential implementation of a device which may be used to decode a codeword, according to certain embodiments. FIG. 7 is merely illustrative of an embodiment incorporating the present invention and does not limit the scope of the invention as recited in the claims. One of ordinary skill in the art would recognize other variations, modifications, and alternatives. In one embodiment, computer system 700 typically includes a monitor 710, a computer 720, user output devices 730, user input devices 740, communications interface 750, and the like.

As shown in FIG. 7, computer 720 may include a processor(s) 760 that communicates with a number of peripheral devices via a bus subsystem 790. These peripheral devices may include user output devices 730, user input devices 740, communications interface 750, and a storage subsystem, such as random access memory (RAM) 770 and disk drive 780.

User input devices 730 include all possible types of devices and mechanisms for inputting information to computer system 720. These may include a keyboard, a keypad, a touch screen incorporated into the display, audio input devices such as voice recognition systems, microphones, and other types of input devices. In various embodiments, user input devices 730 are typically embodied as a computer mouse, a trackball, a track pad, a joystick, wireless remote, drawing tablet, voice command system, eye tracking system, and the like. User input devices 730 typically allow a user to select objects, icons, text and the like that appear on the monitor 710 via a command such as a click of a button or the like.

User output devices 740 include all possible types of devices and mechanisms for outputting information from computer 720. These may include a display (e.g., monitor 710), non-visual displays such as audio output devices, etc.

Communications interface 750 provides an interface to other communication networks and devices. Communications interface 750 may serve as an interface for receiving data from and transmitting data to other systems. Embodiments of communications interface 750 typically include an Ethernet card, a modem (telephone, satellite, cable, ISDN), (asynchronous) digital subscriber line (DSL) unit, FireWire interface, USB interface, and the like. For example, communications interface 750 may be coupled to a computer network, to a FireWire bus, or the like. In other embodiments, communications interfaces 750 may be physically integrated on the motherboard of computer 720, and may be a software program, such as soft DSL, or the like.

In various embodiments, computer system 700 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 720 includes one or more Xeon microprocessors from Intel as processor(s) 760. Further, one embodiment, computer 720 includes a UNIX-based operating system.

RAM 770 and disk drive 780 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 770 and disk drive 780 may be configured to store the basic programming and data constructs that provide the functionality of the present invention.

Software code modules and instructions that provide the functionality of the present invention may be stored in RAM 770 and disk drive 780. These software modules may be executed by processor(s) 760. RAM 770 and disk drive 780 may also provide a repository for storing data used in accordance with the present invention.

RAM 770 and disk drive 780 may include a number of memories including a main random access memory (RAM) for storage of instructions and data during program execution and a read only memory (ROM) in which fixed non-transitory instructions are stored. RAM 770 and disk drive 780 may include a file storage subsystem providing persistent (non-volatile) storage for program and data files. RAM 770 and disk drive 780 may also include removable storage systems, such as removable flash memory.

Bus subsystem 790 provides a mechanism for letting the various components and subsystems of computer 720 communicate with each other as intended. Although bus subsystem 790 is shown schematically as a single bus, alternative embodiments of the bus subsystem may utilize multiple busses.

FIG. 7 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for adaptive decoding performed by a system that comprises a low density parity check (LDPC) decoder, the method comprising:
receiving a first set of values corresponding to a first LDPC codeword and noise;
performing a first plurality of iterations of an iterative decoding algorithm using a first set of decoding parameters to decode the received first set of values;
comparing a checksum value with a first threshold, wherein the checksum value corresponds to a number of parity check failures after the first plurality of iterations, and wherein the first threshold is defined based on at least one of: an error floor or a speed of the iterative decoding algorithm; and
based on the comparing:
selecting a second set of decoding parameters for the iterative decoding algorithm; and
performing a second plurality of iterations of the iterative LDPC decoding algorithm using the second set of decoding parameters to decode the received first set of values and generate a first set of decoded bits.

2. The method of claim 1, wherein the second set of decoding parameters comprises one or more scaling factors and one or more initial log likelihood ratio (LLR) values.

3. The method of claim 1, wherein at least one of the scaling factors in the second set of decoding parameters is different from a corresponding scaling factor in the first set of decoding parameters.

4. The method of claim 1, wherein at least one of the initial log likelihood ratio (LLR) values is in the second set of decoding parameters is different from a corresponding LLR value in the first set of decoding parameters.

5. The method of claim 1, wherein the number of parity check failures is associated with a decoded codeword after the first plurality of iterations.

6. The method of claim 1, further comprising:
calculating the checksum value after each of the first plurality of iterations to generate a plurality of checksum values;
checking if a total number of the plurality of checksum values remain between the first threshold and a second threshold;
performing, based on the total number remaining between the first threshold and the second threshold, the second plurality of iterations of the iterative LDPC decoding algorithm using the second set of decoding parameters to decode the received first set of values and generate a first set of decoded bits.

7. The method of claim 1, wherein the iterative decoding algorithm is a hard decoding message passing algorithm.

8. The method of claim 1, wherein the first set of decoding parameters and the second set of decoding parameters are stored in a table comprising a plurality of sets of decoding parameters.

9. The method of claim 1, wherein the LDPC codeword is irregular having at least a first column weight and a second column weight, wherein a first scaling factor corresponds to one or more columns having the first column weight and the second scaling factor corresponds to one or more columns having the second column weight.

10. An apparatus for adaptive decoding, comprising:
at least one processor configured to:
receive a first set of values corresponding to a first low density parity check (LDPC) codeword and noise;
perform a first plurality of iterations of an iterative decoding algorithm using a first set of decoding parameters to decode the received first set of values;
compare a checksum value with a first threshold, wherein the checksum value corresponds to a number of parity check failures after the first plurality of iterations, and wherein the first threshold is defined based on at least one of: an error floor or a speed of the iterative decoding algorithm; and
based on the compare:
select a second set of decoding parameters for the iterative decoding algorithm;
perform a second plurality of iterations of the iterative LDPC decoding algorithm using the second set of decoding parameters to decode the received first set of values and generate a first set of decoded bits; and
a memory coupled to the at least one processor.

11. The apparatus of claim 10, wherein the second set of decoding parameters comprises one or more scaling factors and one or more initial log likelihood ratio (LLR) values.

12. The apparatus of claim 10, wherein at least one of the scaling factors in the second set of decoding parameters is different from a corresponding scaling factor in the first set of decoding parameters.

13. The apparatus of claim 10, wherein at least one of the initial log likelihood ratio (LLR) values is in the second set of decoding parameters is different from a corresponding LLR value in the first set of decoding parameters.

14. The apparatus of claim 10, wherein the number of parity check failures is associated with a decoded codeword after the first plurality of iterations.

15. The apparatus of claim 10, wherein the at least one processor is further configured to:
calculate the checksum value after each of the first plurality of iterations to generate a plurality of checksum values;
check if a total number of the plurality of checksum values remain between the first threshold and a second threshold;
perform, based on the total number remaining between the first threshold and the second threshold, the second plurality of iterations of the iterative LDPC decoding algorithm using the second set of decoding parameters to decode the received first set of values and generate a first set of decoded bits.

16. The apparatus of claim 10, wherein the iterative decoding algorithm is a hard decoding message passing algorithm.

17. The apparatus of claim 10, wherein the first set of decoding parameters and the second set of decoding parameters are stored in a table comprising a plurality of sets of decoding parameters.

18. The apparatus of claim 10, wherein the LDPC codeword is irregular having at least a first column weight and a second column weight, wherein a first scaling factor corresponds to one or more columns having the first column weight and the second scaling factor corresponds to one or more columns having the second column weight.

19. A non-transitory processor-readable medium for adaptive decoding, comprising processor-readable instructions configured to cause one or more processors to:
receive a first set of values corresponding to a first low density parity check (LDPC) codeword and noise;
perform a first plurality of iterations of an iterative decoding algorithm using a first set of decoding parameters to decode the received first set of values;
compare a checksum value with a first threshold, wherein the checksum value corresponds to a number of parity check failures after the first plurality of iterations, and wherein the first threshold is defined based on at least one of: an error floor or a speed of the iterative decoding algorithm; and
based on the compare:
select a second set of decoding parameters for the iterative decoding algorithm; and
perform a second plurality of iterations of the iterative LDPC decoding algorithm using the second set of decoding parameters to decode the received first set of values and generate a first set of decoded bits.

20. The processor-readable medium of claim 19, wherein the second set of decoding parameters comprises one or more scaling factors and one or more initial log likelihood ratio (LLR) values.

* * * * *